(12) United States Patent
Park et al.

(10) Patent No.: US 10,109,818 B2
(45) Date of Patent: Oct. 23, 2018

(54) PLASTIC SUBSTRATE

(71) Applicant: LG CHEM, LTD., Seoul (KR)

(72) Inventors: Sang Jun Park, Daejeon (KR); Yeon Keun Lee, Daejeon (KR); Yong Nam Kim, Daejeon (KR); Hye Won Jeong, Daejeon (KR); Bo Ra Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 43 days.

(21) Appl. No.: 15/318,928

(22) PCT Filed: Aug. 28, 2015

(86) PCT No.: PCT/KR2015/009064
§ 371 (c)(1),
(2) Date: Dec. 14, 2016

(87) PCT Pub. No.: WO2016/032281
PCT Pub. Date: Mar. 3, 2016

(65) Prior Publication Data
US 2017/0133634 A1    May 11, 2017

(30) Foreign Application Priority Data

Aug. 28, 2014   (KR) ........................ 10-2014-0112911
Aug. 28, 2015   (KR) ........................ 10-2015-0121560

(51) Int. Cl.
*H01L 51/00*   (2006.01)
*H01L 51/52*   (2006.01)
(Continued)

(52) U.S. Cl.
CPC ............ *H01L 51/5268* (2013.01); *C08J 5/00* (2013.01); *C08J 5/18* (2013.01); *C08K 3/22* (2013.01);
(Continued)

(58) Field of Classification Search
CPC ............ H01L 51/5268; H01L 51/0034; H01L 51/0096; H01L 51/0097
See application file for complete search history.

(56) References Cited

FOREIGN PATENT DOCUMENTS

GB    2509065 A    6/2014
JP    08176293 A   7/1996
(Continued)

OTHER PUBLICATIONS

Search Report of European Patent Office in Appl'n No. 15835521.4, dated Feb. 12, 2018.
(Continued)

*Primary Examiner* — Douglas Menz
(74) *Attorney, Agent, or Firm* — Dentons US LLP

(57) ABSTRACT

The present application relates to a plastic substrate, a method for producing same, an organic electronic device, and display light source and lighting apparatus. The plastic substrate according to the present application has superb light extraction efficiency and exhibits an excellent surface roughness characteristic. Furthermore, the method for producing the plastic substrate according to the present application can produce the plastic substrate by means of a process in which scattering components are added secondarily. Moreover, the plastic substrate according to the present application can be utilized as a substrate for an organic electronic device, and the organic electronic device can be utilized as display light source and lighting apparatus.

18 Claims, 5 Drawing Sheets

(51) Int. Cl.

| | |
|---|---|
| *C08J 5/00* | (2006.01) |
| *C08K 7/00* | (2006.01) |
| *C08L 79/08* | (2006.01) |
| *C08L 101/00* | (2006.01) |
| *C08J 5/18* | (2006.01) |
| *C08K 3/22* | (2006.01) |

(52) U.S. Cl.
CPC ............... *C08K 7/00* (2013.01); *C08L 79/08* (2013.01); *C08L 101/00* (2013.01); *H01L 51/0034* (2013.01); *H01L 51/0096* (2013.01); *H01L 51/0097* (2013.01); *C08J 2379/08* (2013.01); *C08K 2003/2241* (2013.01); *H01L 2251/5369* (2013.01); *Y02E 10/549* (2013.01)

(56) References Cited

FOREIGN PATENT DOCUMENTS

| | | |
|---|---|---|
| JP | 2013-077585 A | 4/2013 |
| KR | 1020100063729 A | 6/2010 |
| KR | 1020130026910 A | 3/2013 |
| KR | 1020130045267 | 5/2013 |
| KR | 10-2013-0084251 A | 7/2013 |
| KR | 10-2013-0084782 A | 7/2013 |
| KR | 1020130111482 A | 10/2013 |
| KR | 1020140018806 A | 2/2014 |
| KR | 1020140070491 A | 6/2014 |

OTHER PUBLICATIONS

International Search Report from PCT/KR2015/009064, dated Dec. 3, 2015.
Written Opinion of the ISA from PCT/KR2015/009064, dated Dec. 3, 2015.

[Figure 1]
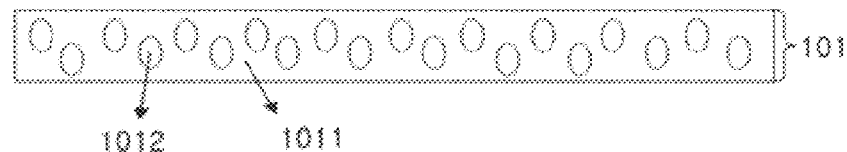
[Figure 2]
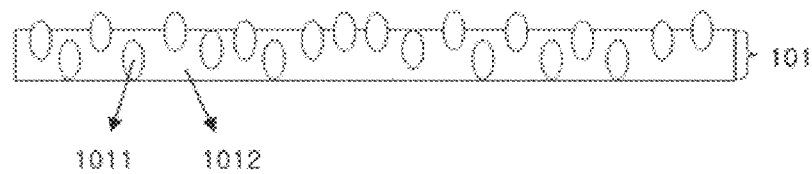
[Figure 3]
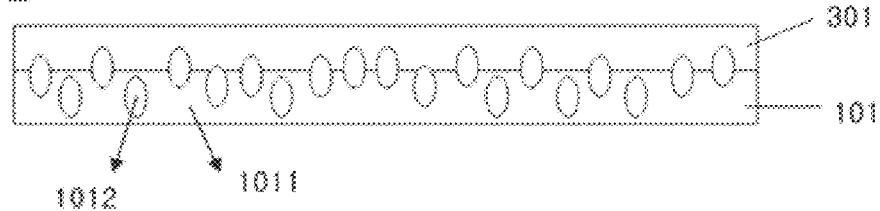
[Figure 4]
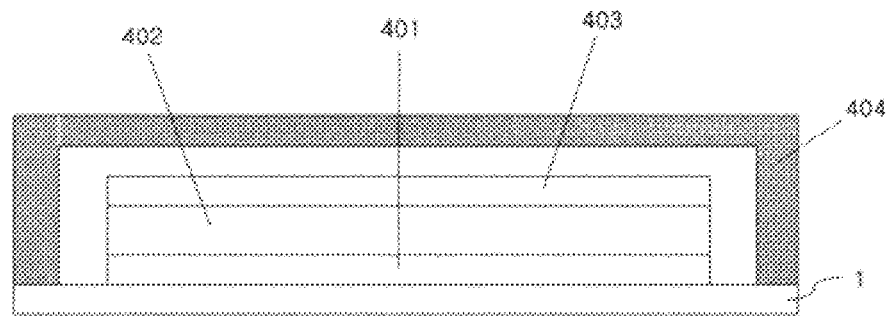

[Figure 5]
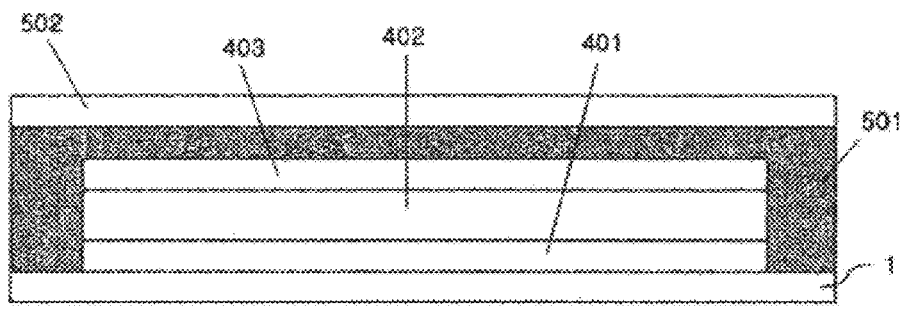
[Figure 6]
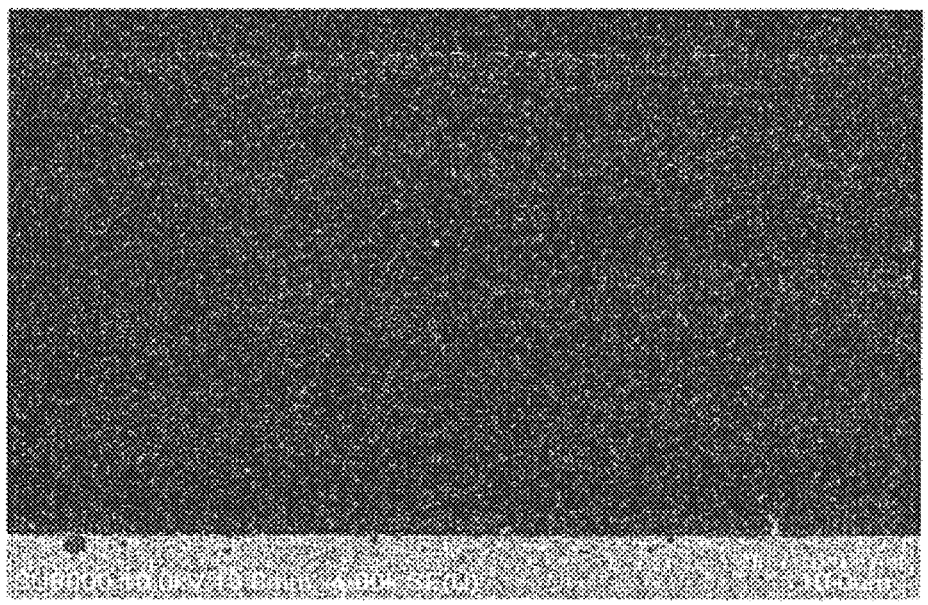

[Figure 7]
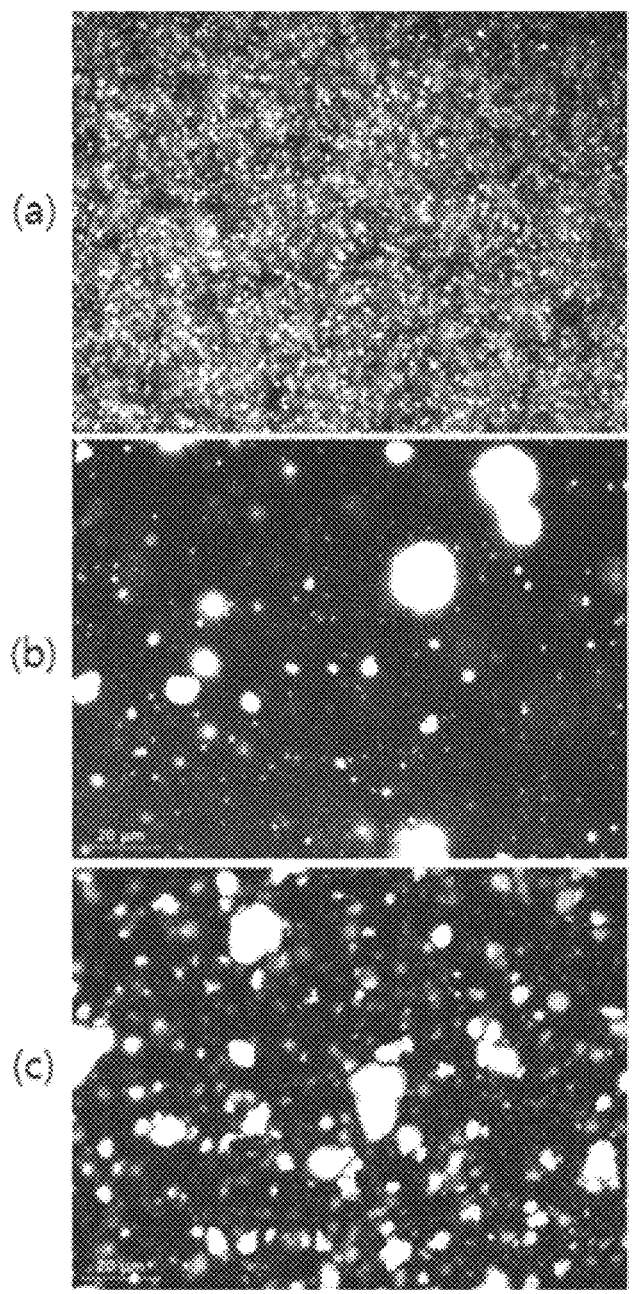

[Figure 8]
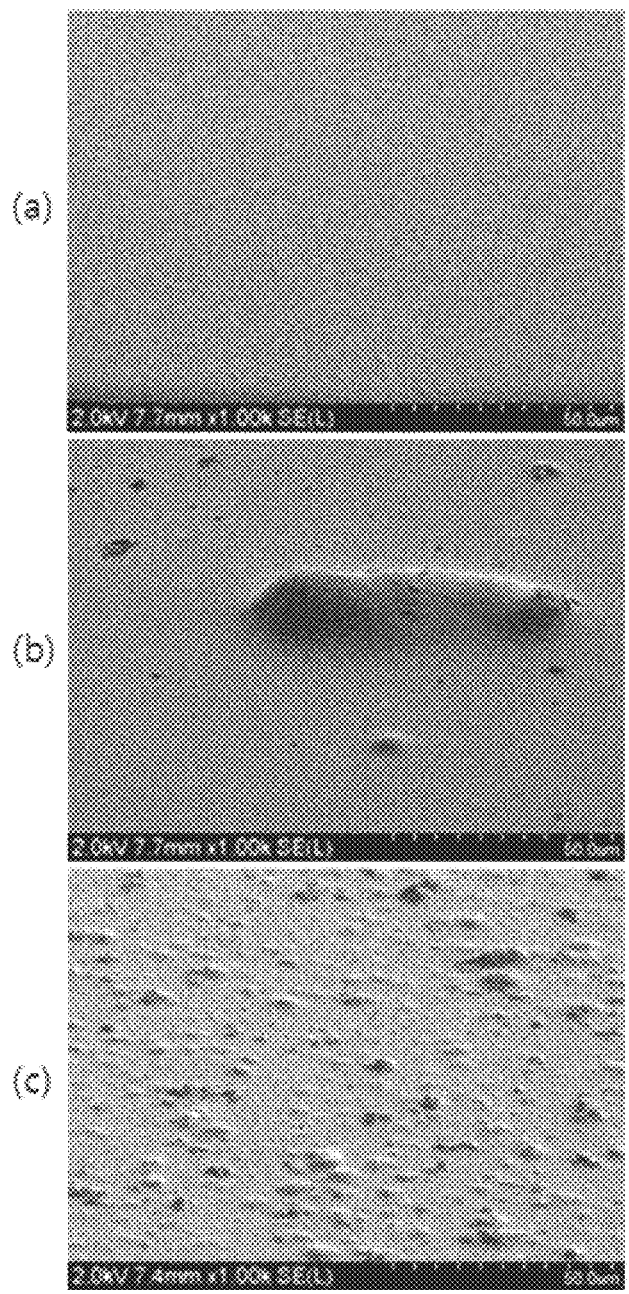

[Figure 9]
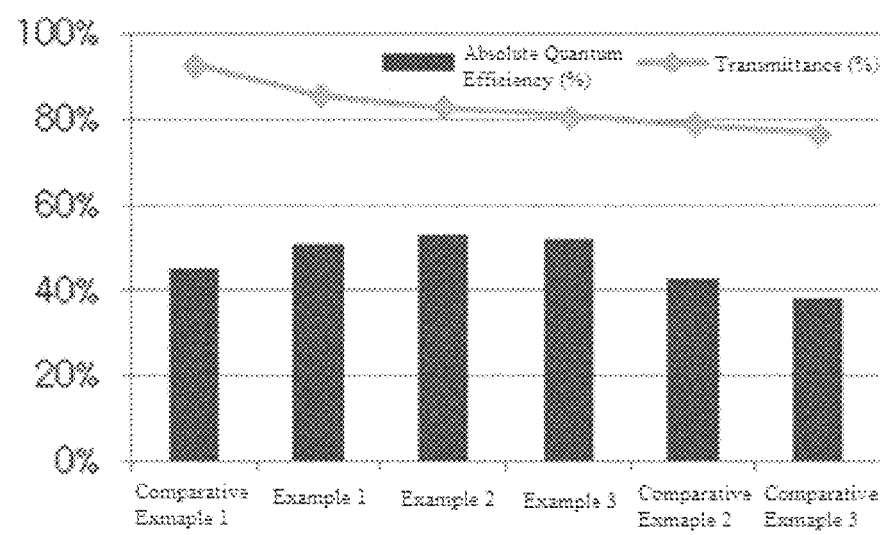

PLASTIC SUBSTRATE

CROSS-REFERENCE TO RELATED APPLICATIONS

This application is a National Stage Application of International Application No. PCT/KR2015/009064, filed Aug. 28, 2015, and claims the benefit of Korean Patent Application No. 10-2015-0121560, filed Aug. 28, 2015, and Korean Patent Application No. 10-2014-0112911, filed Aug. 28, 2014, the contents of which are incorporated herein by reference in their entirety for all purposes as if fully set forth below.

TECHNICAL FIELD

The present application relates to a plastic substrate, a method for producing the substrate, an organic electronic device, a light source, and a lighting apparatus.

BACKGROUND ART

An organic electronic device (OED) is, for example, a device including one or more layers of organic materials that can conduct current, as disclosed in Patent Document 1 (Japanese Unexamined Patent Publication No. 1996-176293). A kind of organic electronic devices include an organic light emitting device (OLED), an organic solar cell, an organic photoconductor (OPC) or an organic transistor, and the like.

The organic light emitting device, which is a typical organic electronic device, usually includes a substrate, a first electrode layer, an organic layer and a second electrode layer in this order. In a structure which is referred to as a so-called bottom emitting device, the first electrode layer may be formed as a transparent electrode layer, and the second electrode layer may be formed as a reflective electrode layer. Furthermore, in a structure which is referred to as a so-called top emitting device, the first electrode layer is also formed as a reflective electrode layer and the second electrode layer is formed as a transparent electrode layer. Electrons and holes injected by electrode layers may be subjected to recombination in an emitting layer present in the organic layer to generate light. Light can be emitted toward the substrate in the bottom emitting device and toward the second electrode layer in the top emitting device.

DISCLOSURE

Technical Problem

The present application provides a plastic substrate, a method for producing the substrate, an organic electronic device, a light source, and a lighting apparatus.

Technical Solution

The present application relates to a plastic substrate. An exemplary plastic substrate of the present application has a supporting layer comprising a polymeric binder and a scattering component included in the polymeric binder. FIG. 1 illustratively shows a plastic substrate (1) having a supporting layer (101) comprising a polymeric binder (1011) and a scattering component (1012) included in the polymeric binder.

As an example, in the plastic substrate the scattering component (1012) may be completely incorporated in the polymeric binder (1011) and the supporting layer (101) may have a flat surface, a shown in FIG. 1. As another example, in the plastic substrate the scattering component (1012) may also be exposed on a surface of the polymeric binder (1011) and the surface of the supporting layer (101) may have a concave-convex structure, as shown in FIG. 2.

The term "scattering component" herein may mean, for example, a material that may have a refractive index different from a surrounding material such as the polymeric binder together with an appropriate size to form a region being capable of scattering, refracting or diffracting the incident light. The scattering component can, for example, be in the form of particles.

A content ratio of the scattering component in the polymeric binder may be properly selected within a range that does not impair objects of the present application. In one example, the scattering component may be included in a ratio in the range of 0.05% to 3.75% by weight in the polymeric binder. "The content ratio of the scattering component in the polymeric binder is A % by weight" herein may mean that the content ratio of the scattering component relative to 100% by weight of the polymeric binder is A % by weight. 100% by weight of the polymeric binder herein may mean a weight ratio based on the weight of the polymeric binder except for the solvent. The upper limit of the content ratio of the scattering component in the polymeric binder may be, specifically, 3.75% by weight or less, 3.5% by weight or less, 3.25% by weight or less, 3% by weight or less, 2.75% by weight or less, 2.5% by weight or less, 2.25% by weight or less, 2% by weight or less, 1.9% by weight or less, 1.8% by weight or less, 1.7% by weight or less or 1.6% by weight or less. The lower limit of the content ratio of the scattering component in the polymeric binder may be, specifically, 0.05% by weight or more, 0.1% by weight or more, 0.15% by weight or more, 0.2% by weight or more, 0.25% by weight or more, 0.3% by weight or more, 0.35% by weight or more, 0.4% or more, 0.45% by weight or more or 0.5% by weight or more. When the content ratio of the scattering component in the polymeric binder is within the above range, the plastic substrate having excellent light extraction efficiency can be provided.

The content ratio of the scattering component in the polymeric binder is not necessarily limited to the above range, but may be also adjusted less than or more than the above range in consideration of haze characteristics of the support layer and/or the plastic substrate intended to be embodied. However, the upper limit of the content ratio of the scattering component in the polymeric binder may be appropriately about 10% by weight, considering an aspect that the plastic substrate of the present application is prepared by adding the scattering component to a polymeric binder precursor secondarily, as described below. When the upper limit of the content ratio of the scattering component in the polymeric binder precursor is greater than about 10% by weight, a phenomenon that a filter is clogged in a step of filtering occurs to make no sufficient filtering, and thus after coating a layer of a composition comprising the polymeric binder precursor and the scattering component the surface of the coating layer is so rough that it may be disadvantageous to manufacture the device.

A thickness of the supporting layer may be appropriately selected within a range that does not impair objects of the present application. In one example, the thickness of the supporting layer may be in a range of about 10 μm to 130 μm. The upper limit of the thickness of the supporting layer may be, specifically, 130 μm or less, 120 μm or less, 110 μm or less, 100 μm or less, 90 μm or less, 80 μm or less, or 70

μm or less. The lower limit of the thickness of the supporting layer may be, specifically, 10 μm or more, 20 μm or more, 30 μm or more, 40 μm or more, 50 μm or more or 60 μm or more. When the thickness of the supporting layer is within the above range, the plastic substrate having excellent light extraction efficiency can be provided.

In addition, it means for the supporting layer itself to have a sufficient thickness so as to be capable of performing a function as a substrate such as an organic electronic device that the thickness of the supporting layer is within the above range. In preparing a conventional plastic substrate having light extraction efficiency, this is different from a structure coating a light extraction layer in a very thin thickness, for example, a thickness of about 2 μm or less on a general plastic substrate (without light extraction efficiency) with a sufficient thickness which may perform a function as a substrate. According to the present application, the supporting layer may perform the function as the substrate and the function as the light extraction layer at the same time, and thus it is advantageous in the production side of the substrate.

The haze of the plastic substrate may be appropriately selected within a range that does not impair objects of the present application. In one example, the haze of the plastic substrate may be in a range of about 5% to 80%. The upper limit of the haze of the plastic substrate may be, specifically, 80% or less, 77.5% or less, 75% or less, 72.5% or less, 70% or less, 67.5% or less, 65% or less, 62.5% or less, 60% or less, 57.5% or less or 55% or less. The lower limit of the haze of the plastic substrate may be, specifically, 5% or more, 7.5% or more, 10% or more, 12.5% or more, 15% or more, 17.5% or more, 20% or more, 22.5% or more, 25% or more, 27.5% or more, 30% or more, 32.5% or more, 35% or more, 37% or more, 40% or more, 42.5% or more, or 45% or more, 47.5% or more, 50% or more or 52.5% or more. If the haze of the plastic substrate is within the above range, the plastic substrate having excellent light extraction efficiency can be provided.

A method for measuring the haze of the plastic substrate herein is not particularly limited and the haze can be measured by employing a haze measurement method known in the art. In one example, the haze may be measured using a D65 light source with a haze measuring instrument known in the art (Hazemeter), for example, HM-150 system from MURAKAMI Co., Ltd.

The plastic substrate may exhibit the haze range even in a state comprising no haze inducing element other than the scattering component of the supporting layer. The plastic substrate herein comprises no haze inducing element other than the scattering component of the supporting layer, which may mean that the element inducing the haze in the plastic substrate is only the scattering component and it further comprises no haze inducing layer or further adds no haze inducing component on polymerizing the polymeric binder.

For example, the plastic substrate of the present application may exhibit a haze in the range from about 5% to 80% in a state that comprises no haze inducing element other than the scattering component of the supporting layer. The upper limit of the haze of the plastic substrate may be, specifically, 80% or less, 77.5% or less, 75% or less, 72.5% or less, 70% or less, 67.5% or less, 65% or less, 62.5% or less, 60% or less, 57.5% or less or 55% or less. The lower limit of the haze of the plastic substrate may be, specifically, 5% or more, 7.5% or more, 10% or more, 12.5% or more, 15% or more, 17.5% or more, 20% or more, 22.5% or more, 25% or more, 27.5% or more, 30% or more, 32.5% or more, 35% or more, 37% or more, 40% or more, 42.5% or more, 45% or more, 47.5% or more, 50% or more or 52.5% or more. According to the present application, the plastic substrate may be prepared by adding the scattering component secondarily prior to conversion from the polymeric binder precursor to the polymeric binder, thereby securing a stable dispersibility of the scattering component in the polymeric binder, so that it can exhibit excellent haze properties as above, although it comprises no separate haze inducing element other than the scattering component.

Furthermore, the plastic substrate of the present application has excellent surface roughness characteristics. The surface roughness characteristics of the substrate herein are excellent, which may mean that the surface roughness of the substrate is low, so that the surface is flat. In the supporting layer comprising the polymeric binder and the scattering component, typically, the higher the content ratio of the scattering component and the thicker the thickness of the supporting layer, it is expected that the haze may be increased. According to the present application, the content ratio of the scattering component is relatively low and the thickness of the supporting layer is relatively high, but as compared with the case having the relatively high ratio of the scattering component and the relatively low thickness of the supporting layer, the plastic substrate can exhibit more excellent surface roughness characteristics, even if it exhibits similar haze characteristics. This can be seen as arising from the relatively low content of the scattering component. Furthermore, as described below, the plastic substrate of the present application is prepared by adding the scattering component to the polymeric binder precursor, which can secure the dispersibility of the scattering component in the supporting layer stably compared to the last-addition method because a phenomenon that the scattering component agglomerates in the surface of the supporting layer may be reduced. If the phenomenon that the scattering component agglomerates in the surface of the plastic substrate occurs, a short may be caused so as to be disadvantageous in manufacturing devices.

Thus, as described above, in preparing the plastic substrate having the light extraction efficiency, the plastic substrate of the present application is more advantageous in terms of dispersion stability of the scattering component in the supporting layer, distribution uniformity of the scattering component and surface roughness characteristics, over the prior art coating the light extraction layer in a very thin thickness on the general plastic substrate with a thickness sufficient being capable of performing the function as a substrate.

In one example, the supporting layer may have a surface roughness (Ra) in a range of about 0.1 nm to 30 nm, measured in a region of at least 20 μm×20 μm. The upper limit of the surface roughness (Ra) may be more specifically 30 nm or less, 27.5 nm or less, 25 nm or less, 22.5 nm or less, 20 nm or less, 17.5 nm or less, 15 nm or less or 12.5 nm or less. The lower limit of the surface roughness (Ra) may be more specifically 0.1 nm or more, 1 nm or less, 2 nm or more, 3 nm or more, 4 nm or more, 5 nm or more, 6 nm or more, 7 nm or more, 8 nm or more or 9 nm or more. If the surface roughness of the supporting layer is within the above range, the plastic substrate can exhibit excellent surface roughness characteristics, and when the plastic substrate is applied to a substrate of an organic electronic device to be described below, it is advantageous in terms of manufacturing organic electronic devices, without causing a problem such as a short.

A method of measuring the surface roughness herein is not particularly limited and the surface roughness can be measured by employing a surface roughness measuring method known in the art. In one example, the surface roughness may be measured using AFM (atomic force microscope) equipment known in the art, for example, NS4 D3100 DEN P-4 Rev. A equipment from Digital Instrument Inc. by non-contact (vibrating) method.

using monomers introducing, for example, a halogen atom, a sulfur atom or a phosphorus atom.

In one example, the polymer binder may include a polyimide compound comprising a repeating unit of Formula 1 below.

[Formula 1]

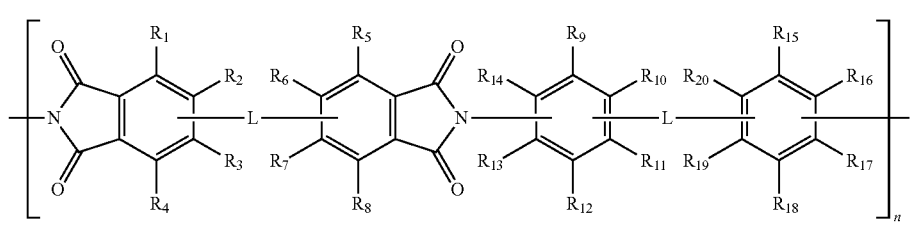

The plastic substrate of the present application also exhibits an excellent translucency. For example, in the plastic substrate the transmittance for light having a wavelength in the visible light range, for example, a wavelength of 550 nm or 638 nm may be at least 80%, at least 82%, at least 84%, at least 86%, at least 88% or at least 90%. To exhibit haze characteristics and/or light extraction efficiency intended to be embodied, the plastic substrate of the present application comprises a relatively low content of the scattering component and uses a supporting layer of a relatively thick thickness, and thus can exhibit the above excellent translucency. Since the plastic substrate of the present application has the above excellent translucency, it may be suitable as a substrate of a bottom emitting organic electronic device, but is not limited thereto.

The plastic substrate of the present application may exhibit an excellent durability and resistance to peeling, and the like even in a process of forming organic electronic devices in which a high temperature is required. For example, the thermal expansion coefficient of the plastic substrate may be in a range of 10 ppm/° C. to 50 ppm/° C., without being limited thereto.

The plastic substrate of the present application may exhibit a high refractive index. In one example, the refractive index for light having a wavelength of 550 nm or 633 nm in the plastic substrate may be about 1.5 or more, about 1.6 or more, about 1.65 or more, or about 1.7 or more. The upper limit of the refractive index is not particularly limited, but for example, may be 1.9 or less, 1.85 or less, 1.80 or less, 1.75 or less. Such a refractive index range can be secured, for example, by forming the plastic substrate with a polymer material having a high refractive index or by blending high refractive index particles in the material of the plastic substrate. If the refractive index of the plastic substrate satisfies the above range, a total reflection phenomenon, and the like may be eliminated or mitigated to embody an organic electronic device having excellent light extraction efficiency.

In one example, the polymeric binder may comprise polyimide, polyethylene naphthalate, polycarbonate, acrylic resin, polyethylene terephthalate, polysulfone, polyether sulfide, polypropylene, polyetherether ketone or polydimethylsiloxane, but is not limited thereto. In one specific example, polyimide may be selected as the above polymeric binder and used, in terms of process temperatures or light extraction efficiency. Such a polyimide may be prepared by In Formula 1, L is a single bond, an alkylene group, an alkylidene group, an alkynylene group, an arylene group, an alkenylene group, —S—, —S(=O)—, —S(=O)2- or —S—S—, $R_1$ to $R_{20}$ are each independently hydrogen, an alkyl group, an alkoxy group, an aryl group or a functional group comprising a halogen atom, a sulfur atom or a phosphorus atom, and n is an integer of 1 or more. In addition, substituents of $R_1$ to $R_{20}$ substituted on carbon atoms linking two ring structures from each other are not present. For example, if the carbon atom linked by $R_2$ and the carbon atom linked by $R_8$ link benzene rings, $R_2$ and $R_5$ are not present.

The term "single bond" herein may mean that no separate atom or atom group is present on the corresponding site. For example, when -L- is a single bond in Formula 1, benzenes on both sides of -L- may be directly linked to form a biphenyl structure.

The alkyl group herein may be, for example, a straight or branched alkyl group having 1 to 20 carbon atoms, 1 to 16 carbon atoms, 1 to 12 carbon atoms, 1 to 8 carbon atoms or 1 to 4 carbon atoms, unless particularly specified otherwise. The alkyl group may be optionally substituted by one or more substituents.

The alkoxy group herein may mean an alkoxy group having 1 to 20 carbon atoms, 1 to 16 carbon atoms, 1 to 12 carbon atoms, 1 to 8 carbon atoms or 1 to 4 carbon atoms, unless particularly specified otherwise. The alkoxy group may be straight, branched or cyclic. The alkoxy group may be optionally substituted by one or more substituents.

The aryl group or the arylene group herein may mean a monovalent residue or bivalent residue derived from an aromatic compound or a derivative thereof comprising benzene or a structure in which two or more benzenes are fused or bonded while sharing two or one carbon atom, unless particularly specified otherwise. The aryl group or the arylene group may be, for example, an aryl group or an arylene group, having 6 to 22 carbon atoms, 6 to 20 carbon atoms, 6 to 18 carbon atoms, 6 to 16 carbon atoms, 6 to 14 carbon atoms or 6 to 12 carbon atoms, and the aryl group or the arylene group may be optionally substituted by one or more substituents.

The alkylene group or the alkylidene group herein may mean, for example, an alkylene group or an alkylidene group, having 1 to 20 carbon atoms, 1 to 16 carbon atoms, 1 to 12 carbon atoms, 1 to 8 carbon atoms or 1 to 4 carbon atoms, unless particularly specified otherwise. The alkylene group or the alkylidene group may be, for example, straight, branched or cyclic. In addition, the alkylene group or the alkylidene group may be optionally substituted by one or more substituents.

The alkenylene group or the alkynylidene group herein may mean, for example, an alkenylene group or an alkynylidene group, having 2 to 20 carbon atoms, 2 to 16 carbon atoms, 2 to 12 carbon atoms, 2 to 8 carbon atoms or 2 to 4 carbon atoms, unless particularly specified otherwise. The alkenylene group or the alkynylidene group may be, for example, straight, branched or cyclic. In addition, the alkenylene group or the alkynylidene group may be optionally substituted by one or more substituents.

The alkenyl group herein may be, for example, an alkenyl group having 2 to 20 carbon atoms, 2 to 16 carbon atoms, 2 to 12 carbon atoms, 2 to 8 carbon atoms or 2 to 4 carbon atoms, unless particularly specified otherwise. The alkenyl group may be, for example, straight, branched or cyclic. In addition, the alkenyl group may be optionally substituted by one or more substituents.

In this specification, as a substituent which may be substituted on an alkyl group, an alkoxy group, an aryl group, an alkylene group, an alkylidene group, an alkenylene group, an alkynylene group or an arylene group, a functional group comprising a halogen atom such as fluorine, chlorine, bromine or iodine, etc., a sulfur atom or a phosphorus atom, a phenyl group, a benzyl group, a naphthyl group or a thiophenyl group and the like may be exemplified, without being limited thereto.

The polymeric binder may be a homopolymer formed by only the repeating unit of Formula 1, or a block or random copolymer comprising other units together in addition to the repeating unit of Formula 1. In addition, both ends of the polymer may be each independently hydrogen, an alkyl group, an alkoxy group, an aryl group or a functional group comprising a halogen atom, a sulfur atom or a phosphorus atom. In the case of the copolymer, kinds or ratios of other repeating units may be suitably selected, for example, from a range that does not inhibit the desired refractive index, heat resistance, or translucency and the like.

The polymeric binder comprising the repeating unit of Formula 1 above may have, for example, a weight average molecular weight in terms of standard polystyrene of 10,000 to 100,000 or about 10,000 to 50,000 or so, measured by GPC (Gel Permeation Chromatograph). The polymeric binder having the repeating unit of Formula 1 has also a light transmittance of at least 80%, at least 85% or at least 90% in a visible light range and an excellent heat resistance.

In the plastic substrate of the present application, an average particle diameter of the scattering component may be in a range of 150 nm to 300 nm. The lower limit of the average particle diameter of the scattering component may be specifically 150 nm or more, 160 nm or more, 170 nm or more, 180 nm or more, 190 nm or more or 200 nm or more. In addition, the upper limit of the average particle diameter of the scattering component may be specifically 300 nm or less, 290 nm or less, 280 nm or less, 270 nm or less, 260 nm or less or 250 nm or less. If the average particle diameter of the scattering component satisfies the above range, the plastic substrate having excellent light extraction efficiency can be provided.

In the plastic substrate of the present application, the scattering component may have higher or lower refractive index relative to surrounding materials, for instance, the polymeric binder. For example, an absolute value of a difference in refractive indices of the polymeric binder and the scattering component for light having a wavelength of 550 nm or 633 nm may be in a range of 0.5 to 1.2. The lower limit of the absolute value of the difference in the refractive indices may be specifically 0.5 or more, 0.55 or more, 0.6 or more, 0.65 or more or 0.7 or more. Furthermore, the upper limit of the absolute value of the difference in the refractive indices may be specifically 1.2 or less, 1.15 or less, 1.1 or less, 1.05 or less, or 1 or less. When the absolute value of the difference in the refractive indices of the polymeric binder and the scattering component satisfies the above range, the organic electronic device having excellent light extraction efficiency can be provided by suitably scattering, refracting or diffracting light incident on the plastic substrate.

In the plastic substrate of the present application, the shape of the scattering component may be appropriately selected within a range that does not impair objects of the present application. In one example, the scattering component may have a shape such as a sphere, an ellipsoid, a polyhedron or an amorphous shape, without being limited thereto.

In the plastic substrate of the present application, as the scattering component, the known materials may be appropriately selected and used, which are known in the art as materials being capable of forming regions that can scatter, refract or diffract the incident light in a state contained in the polymeric binder. The scattering component may comprise, for example, an organic material and/or an inorganic material. As the organic material, for example, organic materials comprising one or more selected from the group consisting of acrylic resin, styrene resin, olefin resin, nylon resin, melamine resin, formaldehyde resin, silicone resin, urethane resin, polyester resin, polycarbonate resin, and derivatives thereof may be exemplified, but is not limited thereto. As the inorganic material, a metal or a metal oxide may be exemplified, but is not limited thereto. As the inorganic material, for example, inorganic materials comprising one or more selected from the group consisting of $TiO_2$, $HfO_2$, $BaTiO_3$, $SnO_2$, $ZrO_2$, $ZnO$, $Al_2O_3$ and $SiO_2$ may be exemplified, but is not limited thereto. The scattering component may be formed by including any one material only or at least two materials of the above materials. For example, hollow particles such as hollow silica or particles of core/shell structure may be also used as the scattering component.

An exemplary plastic substrate of the present application may further have a barrier layer formed on one side or both sides of the support layer. The term "barrier layer" herein may mean a layer having a function for preventing penetration of oxygen, water, nitrogen oxide, sulfur oxide, or ozone in the air. As long as the barrier layer has the above function, it is not particularly limited and may be suitably selected according to the intended use.

In one example, the barrier layer may be formed on one or both sides of the plastic substrate via a buffer layer. That is, the plastic substrate may further comprise the buffer layer formed between the barrier layer and the supporting layer. The buffer layer may serve to improve adhesion between the barrier layer and the substrate layer. The buffer layer may be formed by depositing an inorganic layer such as, for example, $SiO_2$, $SiONx$ or $SiNx$ with a sputtering method or the known vacuum vapor deposition method. If necessary, the buffer layer may be formed by a method with an organic material/inorganic material coating.

As a material of the barrier layer, a material having a function to prevent substances which promote degradation of devices, such as moisture and oxygen, from entering into the device may be selected without limitation and used.

In one example, the barrier layer may include a metal such as In, Sn, Pb, Au, Cu, Ag, Al, Ti and Ni; a metal oxide such as TiO, $TiO_2$, $Ti_3O_3$, $Al_2O_3$, MgO, SiO, $SiO_2$, GeO, NiO, CaO, BaO, $Fe_2O_3$, $Y2O_3$, $ZrO_2$, $Nb_2O_3$ and $CeO_2$; a metal nitride such as SiN; a metal oxynitride such as SiON; a metal fluoride such as $MgF_2$, LiF, $AlF_3$ and $CaF_2$; polyethylene, polypropylene, polymethyl methacrylate, polyimide, polyurea, polytetrafluoroethylene, polychlorotrifluoroethylene, polydichlorodifluoroethylene, or a copolymer of chlorotrifluoroethylene and dichlorodifluoroethylene; a copolymer obtained by copolymerizing tetrafluoroethylene with a comonomer mixture containing at least one comonomer; a fluorinated copolymer having a cyclic structure in the copolymerized backbone; an absorbent material having absorptivity of 1% or more; and a moisture-proof material having an absorption coefficient of 0.1% or less.

In another example, the material of the barrier layer may be a metal oxide. For example, the material of the barrier layer may be a metal oxide of high refractive index. Accordingly, the refractive index of the barrier layer may be, for example, 1.45 or more, about 1.5 or more, about 1.6 or more, about 1.65 or more or about 1.7 or more for a wavelength of 633 nm. In addition, the upper limit of the refractive index of the barrier layer can be adjusted appropriately according to the desired function, and for example, the refractive index for a wavelength of 633 nm may be 2.6 or less, 2.3 or less, 2.0 or less or 1.8 or less. If the refractive index of the barrier layer satisfies the above range, the total reflection phenomenon may be eliminated or mitigated to embody an organic electronic device having excellent light extraction efficiency.

In one example, the barrier layer may be either a single layer structure or a multi-layer structure. The single layer structure may include one material of the barrier layer or at least two materials of the barrier layer as a mixture. The multi-layer structure may be, for example, a structure that two or more layers of the single layer structure are laminated, and in one suitable example, the barrier layer may be the multi-layer structure that a titanium oxide layer (for example, $TiO_2$ layer) and an aluminum oxide layer (for example, $Al_2O_3$ layer) are sequentially laminated.

The thickness of the barrier layer is not particularly limited and can be suitably selected according to the intended use. In one example, the thickness of the barrier layer may be 5 nm to 1000 nm, 7 nm to 750 nm or 10 nm to 500 nm.

The light transmittance of the barrier layer is not particularly limited and may be suitably selected according to the intended use. In one example, the light transmittance of the barrier layer may be at least about 80%, at least 85% or at least 90%.

In one example, the barrier layer may have a refractive index equal to that of the adjacent layer. For example, when an electrode layer is adjacent to the barrier layer, the barrier layer may have a refractive index of 1.5 or more for light having a wavelength of 550 nm or 633 nm. Accordingly, the total reflection phenomenon at the interface between the barrier layer and the electrode layer may be eliminated or mitigated to embody an organic electronic device having excellent light extraction efficiency.

In one example, the barrier layer may have a water vapor transmission rate (WVTR) of $10^4$ $g/m^2 \cdot day$ or less. The water vapor transmission rate may be, for example, a value measured in a condition that a temperature is 40° C. and a relative humidity is 90%. The water vapor transmission rate may be measured using, for example, a water vapor transmission rate measuring instrument (PERMATRAN-W3/31, manufactured by MOCON, Inc.). When the barrier layer satisfies the above numerical range, a curl phenomenon by a foreign material such as moisture or oxygen does not occur even in a high temperature and humidity environment and thus an organic electronic device having excellent durability and accordingly excellent performance may be embodied.

The barrier layer may be a layer formed by, for example, an ALD (Atomic Layer Deposition) method, a vacuum deposition method, a sputtering method, a reactive sputtering method, an MBE (molecular beam epitaxy) method, a cluster ion beam method, an ion plating method, a plasma polymerization method (high frequency excited ion plating method), a plasma CVD method, a laser CVD method, a thermal CVD method, a gas source CVD method or a coating method, and in one suitable example, it may be an atomic layer deposition formed by the ALD method.

The plastic substrate of the present application may further comprise a plane layer. The plane layer may be formed, for example, on one or both sides of the supporting layer. In one example, when the surface of the supporting layer has a concave-convex structure by exposing the scattering component (1012) on the surface of the polymeric binder (1011) as the plastic substrate illustratively shown in FIG. 2, the plane layer may be formed on top of the supporting layer surface with such a uneven structure. FIG. 3 illustratively shows a plastic substrate (1) having a structure that a plane layer (301) is formed on top of the supporting layer (101) having a surface of concave-convex structure.

The plane layer may comprise, for example, high refractive particles together with a binder. The plane layer may be formed using a composition in which high refractive particles are mixed with the binder. The plane layer may provide a surface that can form an organic electronic device including an electrode layer, etc., and have a light scattering property to improve light extraction efficiency of the device. The plane layer may have a refractive index equal to or more than that of the adjacent electrode layer, for example, a refractive index of 1.5 or more for light having a wavelength of 550 nm or 633 nm.

As the binder of the plane layer, the known materials can be used without particular limitation. For example, various organic binders, inorganic binders or organic and inorganic binders, known in the art, may be used. Organic binders, inorganic binders or organic and inorganic binders, having excellent heat resistance and chemical resistance, may be selected and used, considering a lifetime of the device or excellent resistance against a high temperature process, a photo process or an etching process to be performed in the manufacturing processes. The binder may have a refractive index of, for example, about 1.4 or more, about 1.45 or more, about 1.5 or more, about 1.6 or more, about 1.65 or more or about 1.7 or more. The upper limit of the refractive index of the binder may be selected from a range that can satisfy the refractive index of the plane layer, in consideration of the refractive index of the particles to be compounded together. As the binder, for example, epoxy resin, polysiloxane or polyimide may be exemplified.

As the binder of the plane layer, for example, high refractive binders or low refractive binders may be used. The term "high refractive binder" herein may mean a binder having a refractive index of about 1.7 to 2.5 or about 1.7 to 2.0 and the term "low refractive binder" may mean a binder having a refractive index from about 1.4 or more to less than 1.7. Such binders have been variously known, and a suitable binder among various kinds of binders as described above or other known binders may be selected and used.

The plane layer may further comprise high refractive particles. The term "high refractive particles" in the plane layer may be, for example, particles having a refractive index of 1.8 or more, 2.0 or more, 2.2 or more, 2.5 or more, 2.6 or more or 2.7 or more. The upper limit of the refractive index of the high refractive particles may be selected from a range that can satisfy the refractive index of the plane layer, in consideration of the refractive index of the binder and the like to be compounded together. The high refractive particles may have an average particle diameter of, for example, 1 nm to 100 nm, 10 nm to 90 nm, 10 nm to 80 nm, 10 nm to 70 nm, 10 nm to 60 nm, 10 nm to 50 nm or 10 nm to 45 nm or so. As the high refractive particles, for example, alumina, aluminosilicate, titanium oxide or zirconium oxide, and the like may be exemplified. In the high refractive particles, for example, as particles having a refractive index of 2.5 or more, rutile type titanium oxide may be used. Titanium oxide of the rutile type has a higher refractive index than that of the other particles, and thus it may be possible to adjust the desired refractive index even in a relatively low ratio. The refractive index of the high refractive particles may be a refractive index measured for light having a wavelength of 550 nm or 633 nm. In one example, the plane layer may comprise high refractive particles having a refractive index of 1.8 or more for light having a wavelength of 633 nm and an average particle diameter of 50 nm or less.

The ratio of the high refractive particles in the plane layer is not particularly limited, and may be adjusted within a range in which the refractive index of the above-described plane layer can be secured. Considering physical properties of the plane layer, for example, water or moisture permeability or outgassing of the plane layer and the like, the high refractive particles may be included in the plane layer in a ratio of 300 parts by weight or less, 250 parts by weight or less, 200 parts by weight or less, 150 parts by weight or less or 120 parts by weight or less relative to 100 parts by weight of the binder. In addition, the ratio of the high refractive particles may be, for example, 40 parts by weight or more, 60 parts by weight or more, 80 parts by weight or more, or 100 parts by weight or more. The "unit of part by weight" herein means the ratio of weight between the components, unless particularly specified otherwise. In the case of forming, for example, an organic electronic device by maintaining the ratio of the binder and the high refractive particles as above, the device having excellent performance and reliability can be provided by increasing the external quantum efficiency, preventing gas and moisture outside from permeating, and reducing the outgassing.

The plane layer may be formed through, for example, a wet coating method using a coating liquid comprising a binder and high refractive particles, a sol-gel method or a deposition method such as CVD (Chemical Vapor Deposition) or PVD (Physical Vapor Deposition) methods or a micro-embossing method, without being limited thereto.

In another example the plane layer may be also formed using a material that a compound such as alkoxide or acylate of a metal, for example, zirconium, titanium or cerium, is compounded with a binder having a polar group such as a carboxyl group or a hydroxyl group. The compound such as alkoxide or acylate may be subjected to condensation with the polar group present in the binder, which includes the metal in the backbone of the binder, to embody high refractive index. As an example of the alkoxide or acylate compound, titanium alkoxides such as tetra-n-butoxy titanium, tetraisopropoxy titanium, tetra-n-propoxy titanium or tetraethoxy titanium, titanium acylates such as titanium stearate, titanium chelates, zirconium alkoxides such as tetra-n-butoxy zirconium, tetra-n-propoxy zirconium, tetraisopropoxy zirconium or tetraethoxy zirconium, zirconium acylates such as zirconium tributoxystearate, zirconium chelates and the like may be exemplified. The plane layer may be also formed by a sol-gel coating process that a metal alkoxide such as titanium alkoxide or zirconium alkoxide and a solvent such as alcohol or water are compounded to prepare a coating liquid, which is applied and then baked at an appropriate temperature.

The plastic substrate of the present application may further comprise a carrier substrate which is attached to one surface of the supporting layer. In one example, when the barrier layer or the plane layer is further formed on the plastic substrate, the surface opposite the barrier layer or the plane layer may be in contact with the carrier substrate.

In one example, the carrier substrate may be, for example, a glass substrate or a rigid substrate. As the glass substrate, an appropriate material may be used, without particular limitations, and for example, a base material layer such as soda lime glass, barium/strontium-containing glass, lead glass, aluminosilicate glass, borosilicate glass, barium borosilicate glass or quartz may be exemplified, without being limited thereto. In one example, the carrier substrate may be formed to be detachable with the plastic substrate and included.

This application also relates to a method for producing the plastic substrate. An exemplary method for producing the plastic substrate of the present application comprises forming a layer of a composition comprising a polymeric binder precursor and a scattering component and converting the polymeric binder precursor to the polymeric binder in said layer.

In the above method, the composition comprising a polymeric binder precursor and a scattering component may comprise the scattering component in a ratio within a range of about 0.05% by weight to 3.75% by weight relative to 100% by weight of the polymeric binder precursor. "100% by weight of polymer binder precursor" herein may mean a weight ratio based on the weight of the polymeric binder precursor, excluding the solvent. For specific details on the content ratio of the scattering component, the details on the content ratio of the scattering component in the polymeric binder described in the section of the plastic substrate can be same applied.

In the above method, the layer of the composition may be formed to have a thickness in a range of about 10 μm to 130 μm. The layer of the composition may become the supporting layer described in the section of the plastic substrate by converting the polymeric binder precursor to the polymeric binder. Therefore, for specific details on the thickness of the layer of the composition, the details on the thickness of the supporting layer described in the section of the plastic substrate can be same applied.

Since the above method relates to the method for producing the plastic substrate, in the above method, even for the details other than the content ratio of the scattering component and the thickness of the layer of the composition, the details described in the section of the plastic substrate can be same applied. Therefore, in the case of producing a plastic substrate by the above method, the plastic substrate exhibiting the haze characteristics described in the section of the plastic substrate can be produced.

The above method prepares the plastic substrate by adding the scattering component secondarily. The term "second-addition" herein may mean that in the method for producing the plastic substrate having the supporting layer comprising the polymeric binder and the scattering component, a process of adding the scattering component is performed before the polymeric binder precursor is converted to the polymeric binder. That is, the term "second-addition" herein may mean that in the method for producing the plastic substrate, the scattering component is added to the polymeric binder precursor. In contrast, the term "last-addition" herein may mean that in the method for producing the plastic substrate, the process of adding the scattering component is performed after the polymeric binder precursor is converted to the polymeric binder. That is, the term "last-addition" herein may mean that in the method for producing the plastic substrate, the scattering component is added to the polymer binder.

method may be applied. As the coating method, for example, a method such as roll coating, printing method, inkjet coating, slit nozzle method, bar coating, comma coating, spin coating or gravure coating, can be exemplified.

In one example, if the polymeric binder is polyimide, the polymeric binder precursor may be polyamic acid. As the polyamic acid, the known polyamic acid being capable of forming polyimide may be used. For example, the polyamic acid including a repeating unit represented by Formula 2 below may be used as the polyamic acid.

[Formula 2]

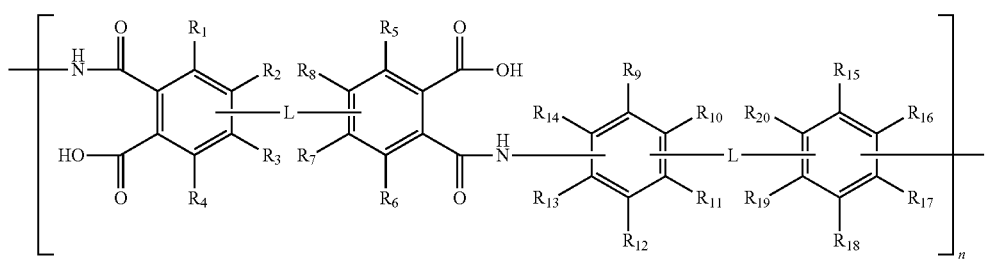

The term "polymeric binder precursor" may mean a material which is an ingredient needed to form the polymeric binder or a precursor material of the polymeric binder in a series of reactions forming the polymeric binder.

The polymeric binder precursor can be appropriately selected according to the type of the polymeric binder. For example, if the polymeric binder is polyimide, the polymeric binder precursor may mean polyamic acid or a monomeric compound for synthesizing polyamic acid. In this case, if the scattering component is compounded to the polyamic acid or the monomeric compound for synthesizing the polyamic acid, the above method can be said to have been added secondarily.

When the scattering component is added secondarily to prepare the plastic substrate as the above method, the stable dispersibility of the scattering component in the polymeric binder precursor and/or the polymeric binder can be secured and thus the plastic substrate having excellent surface roughness characteristics with exhibiting the haze suitable to the light extraction efficiency can be prepared. In contrast, when the scattering component is added lastly to prepare the plastic substrate, the dispersibility of the scattering component in the polymeric binder cannot be secured and thus the aggregation phenomenon of the scattering component can be caused inside the polymeric binder or on the surface of the layer of the composition, thereby it is difficult to exhibit the haze suitable to light extraction efficiency and the surface roughness characteristics are lowered, so that there is a disadvantage on preparing the device.

In the above method, the composition may be prepared by dissolving the polymeric binder precursor and the scattering component in a suitable solvent. As the solvent it is possible to use the known organic solvent such as toluene, xylene, cyclopentanone or cyclohexanone. The composition may further comprise an additive such as a polymerization initiator and a surfactant.

In the above method, the layer of the composition can be formed by applying a composition comprising a polymer binder precursor and a scattering component on a suitable substrate. The substrate can be a carrier substrate described in the section of the plastic substrate. The application method is not particularly limited and the known coating In Formula 2 above, L is a single bond, an alkylene group, an alkylidene group, an alkynylene group, an arylene group, an alkenylene group, —S—, —S(=O)—, —S(=O)$_2$— or —S—S—, $R_1$ to $R_{20}$ are each independently hydrogen, an alkyl group, an alkoxy group, an aryl group or a functional group containing a halogen atom, a sulfur atom or a phosphorus atom, and n is an integer of 1 or more. For the specific details on $R_1$ to $R_{20}$, the details described in the section of Formula 1 of the plastic substrate can be same applied.

In Formula 2 above, substituents of $R_1$ to $R_{20}$ substituted on carbon atoms linking two ring structures from each other are not present. For example, in Formula 2, if the carbon atom linked by $R_2$ and the carbon atom linked by $R_8$ are linked, $R_2$ and $R_8$ are absent, and if —NH— group and the carbon atom linked by $R_{14}$ are linked, $R_{14}$ is absent.

In one example, if the polymeric binder is polyimide, the process for converting the polymeric binder precursor to the polymeric binder in the layer of the composition may be carried out by a process for being subjected to imidization of polyamic acid. Conditions and manners of the imidization are not particularly limited and the conditions and manners of the imidization converting polyamic acid to polyimide known in the art may be applied.

The present application also relates to a use of the plastic substrate. For example, the present application relates to an organic electronic device comprising the plastic substrate. The organic electronic device may comprise a plastic substrate having a supporting layer, which comprises a polymeric binder and a scattering component contained in a ratio within a range of 0.05% by weight to 3.75% by weight in the polymeric binder and has a thickness in a range of 10 μm to 130 μm, and having a haze in a range of 5% to 80%; a first electrode layer formed on the substrate; an organic layer formed on the first electrode layer and a second electrode layer formed on the organic layer. For the plastic substrate of the organic electronic device, the details described in the section of the plastic substrate can be same applied.

The organic layer may comprise at least a light emitting layer. For example, when the first electrode layer is embodied transparently and the second electrode layer is made into a reflective electrode layer, a bottom emitting device that the light generated in the light emitting layer of the organic layer is emitted via an optically functional layer toward the base material layer may be embodied.

The organic electronic device may be an organic light emitting device. In this case, the organic electronic device may have a structure the organic layer comprising at least the light emitting layer is interposed between a hole-injection electrode layer and an electron-injection electrode layer. For example, the first electrode layer formed on the plastic substrate may be a hole-injection electrode layer, and the second electrode layer formed on the organic layer may be an electron-injection electrode layer. The first electrode layer may be a transparent electrode layer.

The organic layer existing between the electron and hole injection electrode layers may comprise at least one or more layers of the light emitting layer. The organic layer may also comprise two or more layers of a plurality of light-emitting layers. If two or more layers of the light emitting layer are included, the light emitting layers may also have a structure divided by an intermediate electrode layer or a charge generating layer (CGL), having a charge generating property.

The light emitting layer may be formed using, for example, various fluorescent or phosphorescent organic materials known in the art. As materials of the light emitting layer, materials of Alq series such as tris(4-methyl-8-quinolinolate)aluminum (III) (Alg3), MAlq3 or Gaq3, cyclopenadiene derivatives such as C-545T ($C_{26}H_{26}N_2O_2S$), DSA-amine, TB SA, BTP, PAP-NPA, spiro-FPA, $Ph_3Si$ (PhTDAOXD), PPCP (1,2,3,4,5-pentaphenyl-1,3-cyclopentadiene), DPVBi (4,4'-bis(2,2'-diphenylvinyl)-1,1'-biphenyl), distyryl benzene or a derivative thereof, or phosphorescent materials such as DCJTB (4-(dicyanomethylene)-2-tert-butyl-6-(1,1,7,7,-tetramethyljulolidyl-9-enyl)-4H-pyran), DDP, AAAP, NPAMLI; or Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, Flrppy (fac-tris[2-(4,5?-difluorophenyl)pyridine-C'2,N] iridium (III)) or $Btp_2Ir(acac)$ (bis(2-(2'-benzo[4,5-a]thienyl)pyridinato-N,C3') iridium(acetylactonate)), but is not limited thereto. The light emitting layer may also have a host-dopant system, which comprises the above materials as a host and also perylene, distyrylbiphenyl, DPT, quinacridone, rubrene, BTX, ABTX or DCJTB, etc. as a dopant.

The light emitting layer can also be formed by suitably employing a type showing light-emitting characteristics among electron-accepting organic compounds or electron-donating organic compounds as described below.

As long as the organic layer comprises the light emitting layer, it can be formed in various structures further comprising other various functional layers known in the art. As a layer that can be included in the organic layer, an electron injection layer, a hole blocking layer, an electron transport layer, a hole transport layer and a hole injection layer and the like can be exemplified.

The electron injection layer or the electron transport layer can be formed, for example, by using the electron-accepting organic compound. As the electron-accepting organic compound above, any known compound may be used without particular limitation. As such an organic compound, polycyclic compounds or derivatives thereof, such as p-terphenyl or quaterphenyl, polycyclic hydrocarbon compounds or derivatives thereof, such as naphthalene, tetracene, pyrene, coronene, chrysene, anthracene, diphenylanthracene, naphthacene or phenanthrene, heterocyclic compounds or derivatives thereof, such as phenanthroline, bathophenanthroline, phenanthridine, acridine, quinoline, quinoxaline or phenazine can be illustrated. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone or rubrene, etc., or derivatives thereof, metal chelate complex compounds disclosed in publications such as Japanese Unexamined Patent Publication No. 1988-295695, Japanese Unexamined Patent Publication No. 1996-22557, Japanese Unexamined Patent Publication No. 1996-81472, Japanese Unexamined Patent Publication No. 1993-009470 or Japanese Unexamined Patent Publication No. 1993-017764, for example, a metal complex having one or more of 8-quinolinolata or derivatives thereof as a ligand, which is metal chelated oxanoid compound, such as tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, oxadiazole compounds disclosed in publications such as Japanese Unexamined Patent Publication No. 1993-202011, Japanese Unexamined Patent Publication No. 1995-179394, Japanese Unexamined Patent Publication No. 1995-278124 or Japanese Unexamined Patent Publication No. 1995-228579, triazine compounds disclosed in Japanese Unexamined Patent Publication No. 1995-157473 and the like, stilbene derivatives or distyrylarylene derivatives disclosed in Japanese Unexamined Patent Publication No. 1994-203963 and the like, styryl derivatives disclosed in Japanese Unexamined Patent Publication No. 1994-88072 and the like, diolefin derivatives disclosed in Japanese Unexamined Patent Publication No. 1994-100857 or Japanese Unexamined Patent Publication No. 1994-207170 and the like; fluorescent brighteners such as benzooxazole compound, benzothiazole compounds or benzoimidazole compounds; distyrylbenzene compounds such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; distyrylpyrazine compounds such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine, dimethylidine compounds or derivatives thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephenylenedimethylidine, 9,10-anthracenediyldimethylidine or 4,4'-(2,2-di-t-butylphenylvinyl)biphenyl, 4,4?-(2,2-diphenylvinyl)biphenyl, silanamine derivatives disclosed in Japanese Unexamined Patent Publication No. 1994-49079 or Japanese Unexamined Patent Publication No. 1994-293788 and the like, polyfunctional styryl compounds disclosed in Japanese Unexamined Patent Publication No. 1994-279322 or Japanese Unexamined Patent Publication No. 1994-279323 and the like, oxadiazole derivatives disclosed in Japanese Unexamined Patent Publication No. 1994-107648 or Japanese Unexamined Patent Publication No. 1994-092947 and the like, anthracene compounds disclosed in Japanese Unexamined Patent Publication No. 1994-206865 and the like, oxynate derivatives disclosed in Japanese Unexamined Patent Publication No. 1994-145146 and the like, tetraphenylbutadiene compounds disclosed in Japanese Unexamined Patent Publication No. 1992-96990 and the like, organic tri-functional compounds disclosed in Japanese Unexamined Patent Publication No. 1991-296595 and the like, coumarin derivatives disclosed in Japanese Unexamined Patent Publication No. 1990-191694 and the like, perylene derivatives disclosed in Japanese Unexamined Patent Publication No. 1990-196885 and the like, naphthalene derivatives disclosed in Japanese Unexamined Patent Publication No. 1990-255789 and the like, phthaloperynone derivatives disclosed in Japanese Unexamined Patent Publication No. 1990-289676 or Japanese Unexamined Patent Publication No. 1990-88689 and the like or styrylamine derivatives disclosed in Japanese Unexamined Patent Publication No. 1990-250292 and the like can be also used as the electron-accepting organic compound contained in the low refractive layer. Furthermore, the electron injection layer above may be formed, for example, using a material such as LiF or CsF.

The hole blocking layer is a layer that may prevent the injected holes from passing through the light emitting layer and entering into the electron-injection electrode layer to improve the lifetime and efficiency of the device, and may be formed in an appropriate portion between the emitting layer and the electron-injection electrode layer by using the known material, if necessary.

The hole injection layer or the hole transport layer can comprise, for example, an electron-donating organic compound. As the electron-donating organic compound, aryl amine compounds, such as N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylamino)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl-N-phenylcarbazole, 4,4'-bis[N-(1-naphthyl)-N-phenylamino]biphenyl, 4,4'-bis[N-(1-naphthyl)-N-phenylamino]-p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4'-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4'-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene or 4,4'-bis(N,N-di-p-tolylamino)terphenyl, and bis(N-1-naphthyl)(N-2-naphthyl)amine, may be typically illustrated, but is not limited thereto.

The hole injection layer or the hole transport layer may be also formed by dispersing an organic compound in a polymer or using a polymer derived from the organic compound. In addition, so-called π-conjugated polymers such as poly-paraphenylenevinylene and its derivatives, hole-transporting non-conjugated polymers such as poly(N-vinylcarbazole) or π-conjugated polymers of polysilane can be also used.

The hole injection layer may be formed by using electrically conductive polymers such as metal phthalocyanine, for example copper phthalocyanine, or non-metal phthalocyanine, a carbon film and polyaniline or may be also formed by reacting the aryl amine compound as an oxidizing agent with a Lewis acid.

Illustratively, the organic light emitting device may have (1) a form of hole injection electrode layer/organic emitting layer/electron injection electrode layer; (2) a form of hole injection electrode layer/hole injection layer/organic light emitting layer/electron injection electrode layer; (3) a form of hole injection electrode layer/organic emitting layer/electron injection layer/electron injection electrode layer; (4) a form of hole injection electrode layer/hole injection layer/organic light emitting layer/electron injection layer/electron injection electrode layer; (5) a form of hole injection electrode layer/organic semiconductor layer/organic emitting layer/electron injection electrode layer; (6) a form of hole injection electrode layer/organic semiconductor layer/electron barrier layer/organic emitting layer/electron injection electrode layer; (7) a form of hole injection electrode layer/organic semiconductor layer/organic emitting layer/adhesion improving layer/electron injection electrode layer; (8) a form of hole injection electrode layer/hole injection layer/hole transport layer/organic emitting layer/electron injection layer/electron injection electrode layer; (9) a form of hole injection electrode layer/insulating layer/organic emitting layer/insulating layer/electron injection electrode layer; (10) a form of hole injection electrode layer/inorganic semiconductor layer/insulating layer/organic emitting layer/insulating layer/electron injection electrode layer; (11) a form of hole injection electrode layer/organic semiconductor layer/insulating layer/organic emitting layer/insulating layer/electron injection electrode layer; (12) a form of hole injection electrode layer/insulating layer/hole injection layer/hole transport layer/organic emitting layer/insulating layer/electron injection electrode layer or (13) a form of hole injection electrode layer/insulating layer/hole injection layer/hole transport layer/organic emitting layer/electron injection layer/electron injection electrode layer, formed in sequence, and optionally may also have a form including organic layers of the structure that at least two emitting layers between the hole injection electrode layer and the electron injection electrode layer are divided by an intermediate electrode layer having charge generating characteristics or a charge generating layer (CGL), without being limited thereto.

In this field, a variety of materials for forming the hole or electron injection electrode layer and the organic layer, for example, the light emitting layer, the electron injection or transport layer, the hole injection or transport layer, and methods for forming the same are known, and all the above methods may be applied to production of the above organic electronic devices.

The organic electronic device may further comprise a sealing structure. The sealing structure may be a protective structure that foreign materials such as moisture or oxygen do not flow into the organic layer of the organic electronic device. The sealing structure may be, for example, a can such as a glass can or a metal can, or a film covering the entire surface of the organic layer.

FIG. 4 illustratively show a form that the first electrode layer (401), the organic layer (402) and the second electrode layer (403) sequentially formed on the plastic substrate (1) are protected by the sealing structure (404) of a can structure such as a glass can or a metal can. As shown in FIG. 4, the sealing structure (404) may be attached to the plastic substrate (1) by, for example, an adhesive. In such a manner, it is possible to maximize the protection effect through the sealing structure.

The sealing structure may be, for example, a film covering the entire surface of the first electrode layer, the organic layer and the second electrode layer. FIG. 5 illustratively shows the sealing structure (501) in a film form covering the entire surface of the first electrode layer (401), the organic layer (402) and the second electrode layer (403). For example, the sealing structure (501) in a film form may have a structure that the plastic substrate (1) and the second substrate (502) are adhered to each other, while covering the entire surface of the first electrode layer (401), the organic layer (402) and the second electrode layer (403), as shown in FIG. 5. As the second substrate above, for example, a glass substrate, a metal substrate, a polymer film or a barrier layer and the like may be exemplified. The sealing structure in a film form may be formed, for example, by applying a liquid material to be cured by heat or irradiation of ultraviolet (UV), such as an epoxy resin, and curing it, or may be formed by a manner that the substrate and the top substrate are laminated using an adhesive sheet and the like prepared ahead in a film form with the epoxy resin and the like.

The sealing structure may comprise metal oxides such as calcium oxide, beryllium oxide, metal halides such as calcium chloride or water adsorbents or getter materials such as phosphorus pentoxide and the like, if necessary. The water adsorbents or getter materials, for example, may be included inside the sealing structure in a film form, or may be present at a predetermined position of the sealing structure of the can structure. Also, the sealing structure may further comprise a barrier film or a conductive film, and the like.

The present application relates also to a use of the organic electronic device, for example, the organic light emitting device. In one example, the present application relates to a display light source comprising the organic electronic device. In another example, the present application relates to a lighting apparatus comprising the organic electronic device. As the display light source, backlights of liquid crystal displays (LCD), lightings, light sources of various sensors, printers, copying machines, etc., dash light sources for vehicles, light sources of traffic lights, indicator lights, display devices, plane light emitters, displays, decorations or various lights and the like may be exemplified.

In addition, when the organic electronic device is applied to the display light source or the illumination device or other uses, other components composing of the display light source or the illumination device or the configuration methods thereof are not particularly limited, and as long as the organic electronic device is applied, any material or method known in the art all can be employed.

Advantageous Effects

The plastic substrate of the present application has excellent light extraction efficiency and surface roughness characteristics. In addition, the method for producing the plastic substrate of the present application can prepare the plastic substrate through the process of adding the scattering component secondarily. Furthermore, the plastic substrate of the present application can be used as a substrate of the organic electronic device, and the organic electronic device may be used as a display light source and a lighting apparatus.

BRIEF DESCRIPTION OF DRAWINGS

FIGS. 1 to 3 show exemplary plastic substrates.
FIGS. 4 and 5 are diagrams illustrating exemplary organic electronic devices.
FIG. 6 shows an SEM cross-sectional image of a plastic substrate of Example 1.
FIG. 7 shows optical microscopic surface images of dark field mode in plastic substrates of Example 4 and Comparative Examples 5 and 6 (scale bar: 20 μm).
FIG. 8 shows SEM surface images of plastic substrates of Example 4 and Comparative Examples 5 and 6.
FIG. 9 is a graph showing transmittances in the visible light range of plastic substrates and absolute quantum efficiencies of organic light emitting devices.

MODE FOR INVENTION

Hereinafter, the substrate will be more specifically described through Examples according to the present application, but the scope of the present application is not restricted by Examples set forth below.

1. Measurement of Transmittance in Plastic Substrate

The transmittance of the plastic substrate was measured using an integrating sphere. More specifically, if the integrating sphere brightness at a state to switch-on the self-absorption correction lamp in the integrating sphere is referred to as $L_0$, the integrating sphere brightness when the sample to be measured has been placed at the center in the integrating sphere is referred to as Ls, and the integrating sphere brightness when a perfect absorber having the same size as the sample has been placed at the center in the integrating sphere is referred to as $L_d$, it is possible to calculate the transmittance of the plastic substrate with Equation 4 below.

$$\text{Substrate transmittance (\%)} = (Ls-L_D)/(L_0-L_D) \times 100 \qquad \text{[Equation 4]}$$

2. Measurement of Haze in Plastic Substrate

The haze of the plastic substrate was measured using a D65 light source by HM-150 system from MURAKAMI Co., Ltd.

3. Measurement of Surface Roughness in Plastic Substrate

The surface roughness of the plastic substrate was measured using AFM (atomic force microscope) equipment, for example, NS4 D3100 DEN P-4 Rev. A equipment from Digital Instrument Inc. by non-contact (vibrating) method.

4. Measurement of Absolute Quantum Efficiency in Organic Electronic Devices

The absolute quantum efficiency of the organic light emitting device was measured by an integrating hemisphere device from OTSUKA Company.

Example 1

Preparation of Plastic Substrate

A plastic substrate having a supporting layer was prepared by using a glass substrate as a carrier substrate. Specifically, a coating liquid was prepared by mixing $TiO_2$ (a refractive index for light having a wavelength of 633 nm: 2.7) as a scattering component with a polymeric liquid of polyamic acid (polyimide precursor), synthesized from 3,3',4,4'-biphenyl tetracarboxylic acid dianhydride and 2,2'-bis(trifluoromethyl)-4,4'-diaminobiphenyl as monomers in a known manner, in an amount that in the finally prepared supporting layer the content ratio of the scattering component could be about 0.1% by weight relative to 100% by weight of polyimide (polyamic acid:scattering component=100:0.1 weight ratio).

Subsequently the coating liquid was coated on the glass substrate in a range that the finally prepared supporting layer could have a thickness of about 30 μm and then subjected to imidization to prepare the plastic substrate, in which the refractive index for light having a wavelength of 633 nm is about 1.6, having the supporting layer that the scattering component is dispersed in polyimide.

The transmittance of the manufactured plastic substrate was about 88%, and the haze was about 5%.

Production of Organic Electronic Device

A hole injection electrode layer comprising ITO (Indium Tin Oxide) was formed on the prepared plastic substrate by the known sputtering method. Continuously, a hole injection layer, a hole transport layer, a light emitting layer, an electron transport layer, an electron injection layer and an electron injection electrode layer were formed using the know materials and methods. Then the above structure was sealed with a glass can to prepare an organic electronic device.

Example 2

The plastic substrate and the organic electronic device were prepared by performing the same method as Example 1 except that in preparing the plastic substrate, the coating liquid was prepared by mixing in an amount that in the finally prepared supporting layer the content ratio of the scattering component could be about 0.5% by weight relative to 100% by weight of polyimide (polyamic acid:scattering component=100:0.5 weight ratio).

The transmittance of the manufactured plastic substrate was about 84%, and the haze was about 26%.

Example 3

The plastic substrate and the organic electronic device were prepared by performing the same method as Example 1 except that in preparing the plastic substrate, the coating liquid was prepared by mixing in an amount that in the finally prepared supporting layer the content ratio of the scattering component could be about 1% by weight relative to 100% by weight of polyimide (polyamic acid:scattering component=100:1 weight ratio).

The transmittance of the manufactured plastic substrate was about 81%, and the haze was about 32%.

Example 4

The plastic substrate and the organic electronic device were prepared by performing the same method as Example 1 except that in preparing the plastic substrate, the coating liquid was prepared by mixing in an amount that in the finally prepared supporting layer the content ratio of the scattering component could be about 0.5% by weight relative to 100% by weight of polyimide (polyamic acid:scattering component=100:0.5 weight ratio), and the coating liquid was coated on the glass substrate in a range that the finally prepared supporting layer could have a thickness of about 14 μm.

The haze of the manufactured plastic substrate was about 33%. FIG. 7 (a) and FIG. 8 (a) show optical microscopic surface images (dark field mode) and SEM surface images of the prepared plastic substrate, respectively.

Comparative Example 1

The plastic substrate and the organic electronic device were prepared by performing the same method as Example 1 except that in preparing the plastic substrate, it was changed to include no scattering particle in the polymeric liquid of polyamic acid.

The transmittance of the manufactured plastic substrate was about 94%, and the haze was about 1%.

Comparative Example 2

The plastic substrate and the organic electronic device were prepared by performing the same method as Example 1 except that in preparing the plastic substrate, the coating liquid was prepared by mixing in an amount that in the finally prepared supporting layer the content ratio of the scattering component could be about 5% by weight relative to 100% by weight of polyimide (polyamic acid:scattering component=100:5 weight ratio).

The transmittance of the manufactured plastic substrate was about 78%, and the haze was about 65%.

Comparative Example 3

The plastic substrate and the organic electronic device were prepared by performing the same method as Example 1 except that in preparing the plastic substrate, the coating liquid was prepared by mixing in an amount that in the finally prepared supporting layer the content ratio of the scattering component could be about 10% by weight relative to 100% by weight of polyimide (polyamic acid:scattering component=100:10 weight ratio).

The transmittance of the manufactured plastic substrate was about 72%, and the haze was about 84%.

Comparative Example 4

The plastic substrate and the organic electronic device were prepared by performing the same method as Example 1 except that in preparing the plastic substrate, the coating liquid was prepared by mixing to polyimide subjected to imidization with adding no scattering particle to the polymeric liquid of polyamic acid in an amount that in the finally prepared supporting layer the content ratio of the scattering component could be about 2% by weight relative to 100% by weight of polyimide (polyimide:scattering component=100:2 weight ratio).

Comparative Example 4 was prepared in such a way that the content ratio of the scattering component was higher than Example 3, but the scattering component was added lastly after completing polymerization of polyamic acid, whereby the aggregation phenomenon of the scattering component did not secure the stable dispersibility in the polymide, and thus the locally high haze was expressed. As a result of measuring the haze, Comparative Example 4 did not exhibit haze characteristics suitable to the light extraction efficiency, and it was confirmed to locally show about 50% or more of haze.

Comparative Example 5

The plastic substrate and the organic electronic device were prepared by performing the same method as Comparative Example 4 except that in preparing the plastic substrate, the coating liquid was prepared by mixing in an amount that in the finally prepared supporting layer the content ratio of the scattering component could be about 0.5% by weight relative to 100% by weight of polyimide (polyimide:scattering component=100:0.5 weight ratio), and the coating liquid was coated on the glass substrate in a range that the finally prepared supporting layer could have a thickness of about 10 μm.

The haze of the manufactured plastic substrate was about 3%. FIG. 7 (b) and FIG. 8 (b) show optical microscopic surface images (dark field mode) and SEM surface images of the prepared plastic substrate, respectively.

Comparative Example 6

The plastic substrate and the organic electronic device were prepared by performing the same method as Comparative Example 4 except that in preparing the plastic substrate, the coating liquid was prepared by mixing in an amount that in the finally prepared supporting layer the content ratio of the scattering component could be about 20% by weight relative to 100% by weight of polyimide (polyimide:scattering component=100:20 weight ratio), and the coating liquid was coated on the glass substrate in a range that the finally prepared supporting layer could have a thickness of about 2 μm.

The haze of the manufactured plastic substrate was about 51%. FIG. 7 (c) and FIG. 8 (c) show optical microscopic surface images (dark field mode) and SEM surface images of the prepared plastic substrate, respectively.

Characteristic Comparison of Examples 1-3 and Comparative Examples 1-3

The contents of the scattering component, haze and transmittance in plastic substrates of Examples 1 to 3 and Comparative Examples 1 to 3 were arranged in Table 1 below, absolute quantum efficiencies of Examples 1 to 3 and Comparative Examples 1 to 3 were measured and shown in Table 1 below and FIG. 9.

TABLE 1

| | C. Ex. 1 | Example 1 | Example 2 | Example 3 | C. Ex. 2 | C. Ex. 3 |
|---|---|---|---|---|---|---|
| Scattering particle content (% by weight) | 0 | 0.1 | 0.5 | 1 | 5 | 10 |
| Haze (%) | 1 | 5 | 26 | 32 | 65 | 84 |
| Transmittance (%) | 94 | 88 | 84 | 81 | 78 | 72 |
| Absolute quantum efficiency (%) | 44 | 51 | 54 | 53 | 42 | 38 |

(C. Ex.: Comparative Example)

DESCRIPTION OF REFERENCE NUMERALS

1: plastic substrate
101: supporting layer
1011: polymeric binder
1012: scattering component
301: plane layer
401: Transparent electrode layer
402: organic layer
403: second electrode layer,
404: can type sealing structure
501: film type sealing structure
502: second substrate

The invention claimed is:

1. A plastic substrate having a supporting layer, which comprises a polymeric binder and a scattering component contained in a ratio within a range of 0.05% by weight to 3.75% by weight in the polymeric binder and has a thickness in a range of 10 μm to 130 μm, and having a haze in a range of 5% to 80%,
   wherein the polymeric binder comprises a repeating unit of Formula 1 below:

[Formula 1]

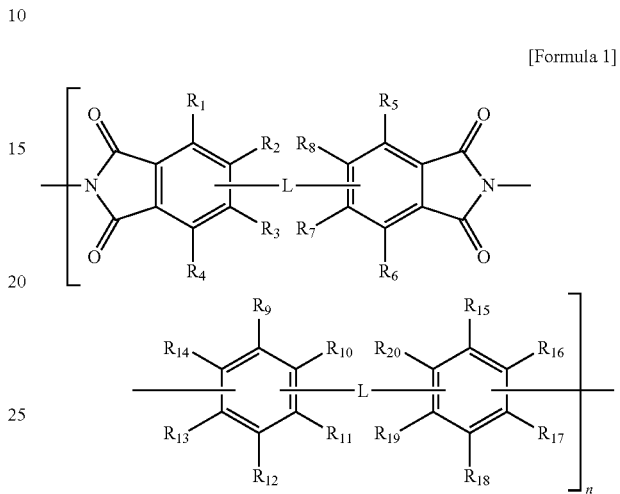

wherein, L is a single bond, an alkylene group, an alkylidene group, an alkynylene group, an arylene group, an alkenylene group, —S—, —S(=O)—, —S(=O)$_2$— or —S—S—, $R_1$ to $R_{20}$ are each independently hydrogen, an alkyl group, an alkoxy group, an aryl group or a functional group comprising a halogen atom, a sulfur atom or a phosphorus atom, n is an integer of 1 or more, and substituents of $R_1$ to $R_{20}$ substituted on carbon atoms linking two ring structures from each other are not present.

2. The plastic substrate according to claim 1, wherein a transmittance is 80% or more for light having at least a wavelength in the visible light range.

3. The plastic substrate according to claim 1, wherein a thermal expansion coefficient is in a range of 10 ppm/° C. to 50 ppm/° C.

4. The plastic substrate according to claim 1, wherein a refractive index is 1.5 or more for light having a wavelength of 550 nm or 633 nm.

5. The plastic substrate according to claim 1, wherein the scattering component is scattering particles having an average particle diameter within a range of 150 nm to 300 nm.

6. The plastic substrate according to claim 1, wherein the absolute value of difference of refractive indices in the polymeric binder and the scattering component is in a range of 0.5 to 1.2.

7. The plastic substrate according to claim 1, wherein the scattering component comprises one or more selected from the group consisting of $TiO_2$, $HfO_2$, $BaTiO_3$, $SnO_2$, $ZrO_2$, ZnO, $Al_2O_3$, and $SiO_2$.

8. The plastic substrate according to claim 1, showing the haze within a range of 5% to 80% in a state comprising no haze inducing element other than the scattering component of the supporting layer.

9. The plastic substrate according to claim 1, wherein the supporting layer has a surface roughness (Ra) within a range of 0.1 nm to 30 nm, measured in a region of at least 20 μm×20 μm.

10. The plastic substrate according to claim 1, further forming a barrier layer having a refractive index of 1.5 or more for light having a wavelength of 550 nm or 633 nm on one or both sides of the supporting layer.

11. The plastic substrate according to claim 10, further comprising a buffer layer formed between the barrier layer and the support layer.

12. The plastic substrate according to claim 1, further comprising a plane layer having a refractive index of 1.5 or more for light having a wavelength of 550 nm or 633 nm.

13. The plastic substrate according to claim 1, further comprising a carrier substrate attached to one or both sides of the supporting layer.

14. A method for producing the plastic substrate of claim 1, comprising forming a layer having a thickness of 10 μm to 130 μm by using a composition comprising a polymeric binder precursor and a scattering component in a ratio within a range of 0.05% by weight to 3.75% by weight relative to 100% by weight of said polymeric binder precursor, and converting said polymeric binder precursor to the polymeric binder in said layer, wherein the polymeric binder precursor comprises a repeating unit of Formula 2 below:

[Formula 2]

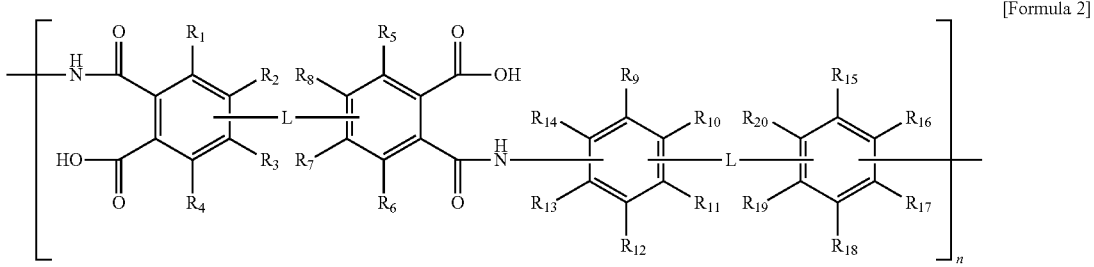

wherein, L is a single bond, an alkylene group, an alkylidene group, an alkynylene group, an arylene group, an alkenylene group, —S—, —S(=O)—, —S(=O)$_2$— or —S—S—, $R_1$ to $R_{20}$ are each independently hydrogen, an alkyl group, an alkoxy group, an aryl group or a functional group comprising a halogen atom, a sulfur atom or a phosphorus atom, n is an integer of 1 or more, and substituents of $R_1$ to $R_{20}$ substituted on carbon atoms linking two ring structures from each other are not present.

15. An organic electronic device comprising the plastic substrate of claim 1; a first electrode layer formed on said substrate; an organic layer formed said first electrode layer and a second electrode layer formed on said organic layer.

16. The organic electronic device according to claim 15, wherein the organic layer comprises a light emitting layer.

17. A display light source comprising the organic electronic device of claim 15.

18. A lighting apparatus comprising the organic electronic device of claim 15.

* * * * *